United States Patent
Ryu et al.

(10) Patent No.: US 11,095,988 B2
(45) Date of Patent: Aug. 17, 2021

(54) ELECTRONIC DEVICE COMPRISING SPEAKER

(71) Applicant: Samsung Electronics Co., Ltd., Gyeonggi-do (KR)

(72) Inventors: Hee Jun Ryu, Gyeonggi-do (KR); Ki Won Kim, Gyeonggi-do (KR); Sang Hoon Kim, Gyeonggi-do (KR); Sang Woo Bae, Gyeonggi-do (KR); Yeo Jin Kim, Gyeonggi-do (KR); Chang Tae Kim, Gyeonggi-do (KR); Sung Bin Hong, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/759,775

(22) PCT Filed: Oct. 30, 2018

(86) PCT No.: PCT/KR2018/013031
§ 371 (c)(1),
(2) Date: Apr. 28, 2020

(87) PCT Pub. No.: WO2019/088668
PCT Pub. Date: May 9, 2019

(65) Prior Publication Data
US 2020/0329315 A1    Oct. 15, 2020

(30) Foreign Application Priority Data
Nov. 1, 2017 (KR) .................. 10-2017-0144970

(51) Int. Cl.
*H04R 29/00* (2006.01)
*H04R 3/00* (2006.01)
(Continued)

(52) U.S. Cl.
CPC ............... *H04R 9/06* (2013.01); *H03F 1/52* (2013.01); *H04M 1/035* (2013.01); *H04R 3/007* (2013.01);
(Continued)

(58) Field of Classification Search
CPC .... H04R 29/00; H04R 29/001; H04R 29/002; H04R 29/003; H04R 3/00; H04R 3/007;
(Continued)

(56) References Cited

U.S. PATENT DOCUMENTS 5,818,301 A * 10/1998 Higashiyama ............ H03F 1/52
330/266
9,173,020 B2 * 10/2015 Cheng .................... H03G 7/002
(Continued)

FOREIGN PATENT DOCUMENTS

EP            2712209 A2    3/2014
KR    10-2006-0061658 A    6/2006
(Continued)

OTHER PUBLICATIONS

European Search Report dated Nov. 13, 2020.

*Primary Examiner* — Thang V Tran
(74) *Attorney, Agent, or Firm* — Cha & Reiter, LLC

(57) ABSTRACT

An electronic device according to an embodiment may comprise: a speaker, an amplifier connected to the speaker through a first electrical path; and at least one processor electrically connected to the amplifier, wherein the at least one processor is configured to: provide a first audio signal set to a first volume level to the speaker via the amplifier; when the first volume level is less than a predetermined first value, output the first audio signal at the first volume level through the speaker; and when the first volume level is equal to or greater than the first value, control a volume level of
(Continued)

the first audio signal on the basis of a temperature value of the speaker, which is estimated from the first audio signal.

15 Claims, 10 Drawing Sheets

(51) Int. Cl.
    *H04R 9/06* (2006.01)
    *H03F 1/52* (2006.01)
    *H04M 1/03* (2006.01)
    *H04R 9/02* (2006.01)

(52) U.S. Cl.
    CPC ............. *H04R 9/02* (2013.01); *H04R 29/001* (2013.01); *H03F 2200/03* (2013.01); *H04R 2430/01* (2013.01)

(58) Field of Classification Search
    CPC ... H04R 3/12; H04R 9/02; H04R 9/06; H04R 2430/01; H03F 1/52; H03F 2200/03; H03G 11/00; G10K 7/22; G10K 7/24; G10K 7/245
    See application file for complete search history.

(56) References Cited

U.S. PATENT DOCUMENTS

| | | | |
|---|---|---|---|
| 9,621,989 B1 | 4/2017 | Garner et al. | |
| 9,729,986 B2 | 8/2017 | Crawley et al. | |
| 9,807,528 B1* | 10/2017 | Jensen | H04R 3/007 |
| 9,942,676 B1* | 4/2018 | Jensen | H04R 29/003 |
| 10,015,608 B2 | 7/2018 | Crawley et al. | |
| 2005/0163324 A1* | 7/2005 | Neunaber | H03G 11/04 |
| | | | 381/55 |
| 2009/0257599 A1 | 10/2009 | Sand Jensen et al. | |
| 2011/0194705 A1* | 8/2011 | Gautama | H04R 29/001 |
| | | | 381/59 |
| 2014/0086418 A1 | 3/2014 | Lubberhuizen et al. | |
| 2014/0126730 A1 | 5/2014 | Crawley et al. | |
| 2014/0169571 A1* | 6/2014 | Polleros | H04R 9/06 |
| | | | 381/55 |
| 2015/0263684 A1* | 9/2015 | Tu | H04R 3/007 |
| | | | 381/120 |
| 2016/0105746 A1 | 4/2016 | Berthelsen et al. | |
| 2016/0360331 A1* | 12/2016 | Yeh | H04R 3/04 |
| 2017/0188146 A1 | 6/2017 | Garner et al. | |
| 2017/0303057 A1 | 10/2017 | Crawley et al. | |
| 2018/0358937 A1* | 12/2018 | Nakata | H03F 3/45 |

FOREIGN PATENT DOCUMENTS

| | | |
|---|---|---|
| KR | 10-2007-0051204 A | 5/2007 |
| KR | 10-2008-0056572 A | 6/2008 |
| KR | 10-2013-0141966 A | 12/2013 |

* cited by examiner

ELECTRONIC DEVICE COMPRISING SPEAKER

CROSS REFERENCE TO RELATED APPLICATIONS

This application is a National Phase Entry of PCT International Application No. PCT/KR2018/013031, which was filed on Oct. 30, 2018, and claims a priority to Korean Patent Application No. 10-2017-0144970, which was filed on Nov. 1, 2017, the contents of which are incorporated herein by reference.

TECHNICAL FIELD

Embodiments disclosed in the disclosure relate to a technology about an electronic device including a speaker to which a thermal protection function is applied.

BACKGROUND ART

When a strong current flows through a coil inside a speaker, a temperature of the coil increases. An electronic device may control a volume level of the speaker such that the temperature of the speaker coil does not increase equal to or greater than a threshold value. An electronic device including a speaker to which a thermal protection function is applied predicts a temperature value inside the speaker and lowers a volume level of the speaker when a temperature value exceeding the threshold value is predicted, thereby preventing heat damage to a speaker coil.

DISCLOSURE

Technical Problem

A thermal protection operation for a speaker may be performed based on a temperature value of a speaker estimated from a resistance value inside the speaker. For example, an electronic device may measure the resistance value from an audio signal input to the speaker and estimate the temperature value of the speaker therefrom. Therefore, the accurate resistance value must be measured to perform the thermal protection operation.

In one example, a contact resistance is an electrical resistance that occurs when a current flows through a contact portion of two conductors that are in contact with each other. A contact resistance value has a characteristic of being measured to increase exponentially as a value of the current flowing through the contact portion decreases.

When the contact resistance exists on an electrical path through which the audio signal is transmitted and received, the audio signal may be affected by the contact resistance. For example, when an audio signal with a low volume level is transmitted and received, a weak current may flow through the electrical path and the contact resistance value may be great.

When the electronic device including the speaker performs the thermal protection operation, malfunction may occur because of the contact resistance. For example, when a volume level of the audio signal is low, the resistance value inside the speaker may be measured higher than an actual resistance value. For example, a crack or a foreign material may exist in a connecting member such as a c-clip on the electrical path through which the audio signal is transmitted and received. As a result, the resistance value inside the speaker may be measured higher than the actual resistance value because of an effect of the contact resistance.

In this connection, because the estimated temperature value of the speaker is higher than an actual temperature value of the speaker, the electronic device may unnecessarily reduce a volume level of the speaker.

Embodiments disclosed in the disclosure are intended to provide an electronic device including a speaker to which a thermal protection function in consideration of a contact resistance is applied.

Technical Solution

An aspect of the disclosure provides an electronic device including a speaker, an amplifier connected to the speaker through a first electrical path, and at least one processor electrically connected to the amplifier, wherein the at least one processor provides a first audio signal set to a first volume level to the speaker through the amplifier, outputs the first audio signal at the first volume level through the speaker when the first volume level is less than a prespecified first value, and controls a volume level of the first audio signal based on a temperature value of the speaker estimated from the first audio signal when the first volume level is equal to or greater than the first value.

An aspect of the disclosure provides an electronic device including a speaker and at least one processor electrically connected to the amplifier, wherein the at least one processor identifies a volume level of an audio signal input to the speaker, outputs the audio signal at the volume level through the speaker when the volume level falls within a prespecified first range, estimates a temperature of the speaker using a voltage value or a current value of the audio signal input to the speaker when the volume level falls within a second range greater than the first range, and adjusts the volume level of the audio signal to a volume level lower than the identified volume level based on the temperature of the speaker and outputs the adjusted audio signal.

Advantageous Effects

According to the embodiments disclosed in the disclosure, malfunction of the thermal protection function because of the contact resistance may be prevented. In addition, various effects that may be directly or indirectly identified through the disclosure may be provided.

MODE FOR INVENTION

Figure 1A:
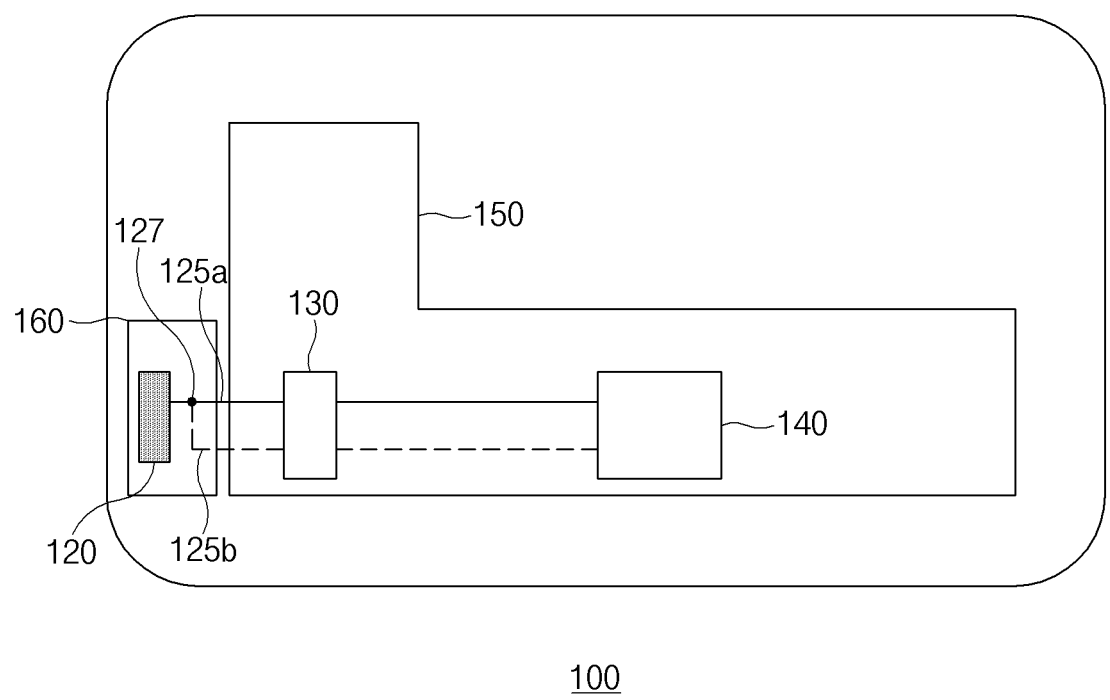
FIG. 1A illustrates an internal structural diagram of an electronic device according to one embodiment of the disclosure.

Hereinafter, various embodiments of the present disclosure will be described with reference to the accompanying drawings. Accordingly, those of ordinary skill in the art will recognize that modification, equivalent, and/or alternative on the various embodiments described herein can be variously made without departing from the scope of the present disclosure. With regard to description of drawings, similar components may be marked by similar reference numerals.

In the disclosure disclosed herein, the expressions "have", "may have", "include" and "comprise", or "may include" and "may comprise" used herein indicate existence of corresponding features (for example, elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments of the present disclosure, but do not limit the elements. For example, such terms are used only to distinguish an element from another element and do not limit the order and/or priority of the elements. For example, a first user device and a second user device may represent different user devices irrespective of sequence or importance. For example, without departing the scope of the present disclosure, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to the other element or an intervening element (for example, a third element) may be present. In contrast, when an element (for example, a first element) is referred to as being "directly coupled with/to" or "directly connected to" another element (for example, a second element), it should be understood that there are no intervening element (for example, a third element).

According to the situation, the expression "configured to" used herein may be used as, for example, the expression "suitable for", "having the capacity to", "designed to", "adapted to", "made to", or "capable of". The term "configured to (or set to)" must not mean only "specifically designed to" in hardware. Instead, the expression "a device configured to" may mean that the device is "capable of" operating together with another device or other components.

For example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in this specification are used to describe specified embodiments of the present disclosure and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal meaning unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMI's), MP3 players, mobile medical devices, cameras, and wearable devices. According to various embodiments of the present disclosure, the wearable devices may include accessories (for example, watches, rings, bracelets, ankle bracelets, glasses, contact lenses, or head-mounted devices (HMDs)), cloth-integrated types (for example, electronic clothes), body-attached types (for example, skin pads or tattoos), or implantable types (for example, implantable circuits).

In some embodiments, an electronic device may be a home appliance. The home appliance may include, for example, at least one of a television, a digital video disk player (DVD player), an audio, a refrigerator, an air conditioner, a cleaner, an oven, a microwave, a washing machine, an air purifier, a set-top box, a home automation control panel, a security control panel, a TV box (e.g., a Samsung HomeSync™, an Apple TV™, or a Google TV™), a game console (e.g., a Xbox™ or a PlayStation™), an electronic dictionary, an electronic key, a camcorder, and an electronic picture frame.

In another embodiment, the electronic device may include at least one various medical devices (e.g., various portable medical measuring devices (a blood glucose meter, a heart rate meter, a blood pressure meter, a body temperature meter, or the like), a magnetic resonance angiography (MRA), a magnetic resonance imaging (MRI), a computed tomography (CT), a camera, an ultrasound device, or the like), a navigation device, a global navigation satellite system (GNSS), an event data recorder (EDR), a flight data recorder (FDR), an automotive infotainment device, a marine electronic equipment (e.g., a marine navigation device, a gyro compasses, or the like), avionics, a security device, a head unit for a vehicle, an industrial or household robot, an automatic teller's machine (ATM) at a financial institution, a point of sales (POS) at a store, and internet of things (e.g., a light bulb, various sensors, an electricity or gas meter, a sprinkler device, a fire alarm, a thermostat, a street light, a toaster, an exercise equipment, a hot water tank, a heater, a boiler, or the like).

In some embodiment, the electronic device may include at least one of a furniture or a portion of a building/structure, an electronic board, an electronic signature receiving device, a projector, and various measuring devices (e.g., a water, electricity, gas, or a radio wave measuring device). In various embodiments, the electronic device may be one of the various devices described above or a combination of one or more of the various devices described above. The electronic device according to some embodiment may be a flexible electronic device. In addition, the electronic device according to the embodiment of the disclosure may not be limited to the above-described devices, and may include a new electronic device based on a technological development.

Hereinafter, electronic devices according to an embodiment of the present disclosure will be described with reference to the accompanying drawings. The term "user" used herein may refer to a person who uses an electronic device or may refer to a device (for example, an artificial intelligence electronic device) that uses an electronic device.

FIG. 1A illustrates an internal structural diagram of an electronic device according to one embodiment of the disclosure.

Referring to FIG. 1A, an electronic device 100 according to an embodiment may include a speaker 120. The speaker 120 may output an audio signal out of the electronic device 100.

In one embodiment, the electronic device 100 may include an amplifier 130 connected to the speaker 120 through electrical paths 125a and 125b. The audio signal may be transmitted and received through the electrical paths 125a and 125b. A contact resistance may exist on the electrical paths 125a and 125b.

In one embodiment, the electronic device 100 may include at least one processor 140 electrically connected to the amplifier 130. The at least one processor 140 may be referred to as at least one application processor and/or at least one digital signal processor included in the at least one amplifier 130. Referring to FIG. 1A, one application processor 140 is illustrated as an example.

In one embodiment, the at least one processor 140 may provide a first audio signal set to a first volume level to the speaker 120 through the amplifier 130. For example, the first audio signal may be provided to the speaker 120 through the electrical path 125a (a solid line) between the at least one processor 140 and the speaker 120. The first volume level may be referred to as a volume level of the first audio signal. The first volume level may be set by a user or a system.

In one embodiment, when the first volume level is less than a prespecified first value, the at least one processor 140 may control the speaker 120 to output the first audio signal at the set first volume level. When the first volume level is equal to or greater than the first value, the at least one processor 140 may be set to control the volume level of the first audio signal based on a temperature value of the speaker 120 estimated from the first audio signal.

In one embodiment, the electronic device 100 may determine whether to perform a thermal protection operation based on the first volume level of the first audio signal. For example, the first value may be referred to as a threshold value for performing the thermal protection operation for the speaker 120. For example, when the first volume level of the first audio signal is less than the prespecified first value, the at least one processor 140 may not perform any control on the first volume level. However, when the first volume level is equal to or greater than the first value, the at least one processor 140 may perform the thermal protection operation by controlling the volume level of the first audio signal.

In various embodiments, the contact resistance may exist on an electrical path 125b through which the first audio signal is transmitted. The lower the first volume level of the first audio signal, the lower the intensity of a current on the electrical path 125b, so that a value of the contact resistance may be high. Therefore, a resistance value calculated by the processor 140 from the first audio signal may be measured to be greater than an actual resistance value of the speaker 120. When the measured resistance value is large, the temperature value of the speaker 120 may also be estimated to be high. The at least one processor 140 may omit the thermal protection operation when the first volume level of the first audio signal is less than the prespecified first value to prevent the thermal protection operation from being performed based on the incorrectly estimated temperature value of the speaker 120.

On the other hand, the higher the first volume level of the first audio signal, the higher the intensity of the current on the electrical path 125b, so that the contact resistance value may be low. Therefore, the resistance value calculated by the processor 140 from the first audio signal may be measured similarly to the actual resistance value of the speaker 120. The estimated temperature value of the speaker 120 may also be measured similarly to an actual temperature value. Therefore, when the first volume level is equal to or greater than the first value, the at least one processor 140 may perform the thermal protection operation by controlling the volume level of the first audio signal.

In various embodiments, the first value may be referred to as a preset reference value such that an effect of the contact resistance may be considered. The first value may be determined experimentally considering a relationship between the volume level of the audio signal and the current intensity and a relationship between the contact resistance value and the current intensity.

In various embodiments, the at least one processor 140 may obtain a feedback signal corresponding to the first audio signal from a first point 127 on the first electrical paths 125a and 125b adjacent to the speaker 120. For example, the feedback signal may be transmitted to the processor 140 through the electrical path 126b (a dotted line).

In various embodiments, the first audio signal provided from the processor 140 to the speaker 120 through the amplifier 130 may be retransmitted to the at least one processor 140 as the feedback signal through the first point 127.

For example, the electronic device 100 may perform the thermal protection operation based on the feedback signal. The at least one processor 140 may control the volume level of the audio signal provided to the speaker 120 based on the feedback signal. For example, the at least one processor 140 may reduce the volume level of the first audio signal based on the temperature value of the speaker 120 estimated from the feedback signal. The electronic device 100 may prevent damage to the speaker 120 because of a high temperature.

For example, the electronic device 100 may determine whether to perform the thermal protection operation based on the first volume level of the first audio signal. For example, when the first volume level of the first audio signal is less than the prespecified first value, the at least one processor 140 may ignore the obtained feedback signal. When the first volume level is equal to or greater than the first value, the at least one processor 140 may control the volume level of the first audio signal based on the obtained feedback signal.

Figure 1B:
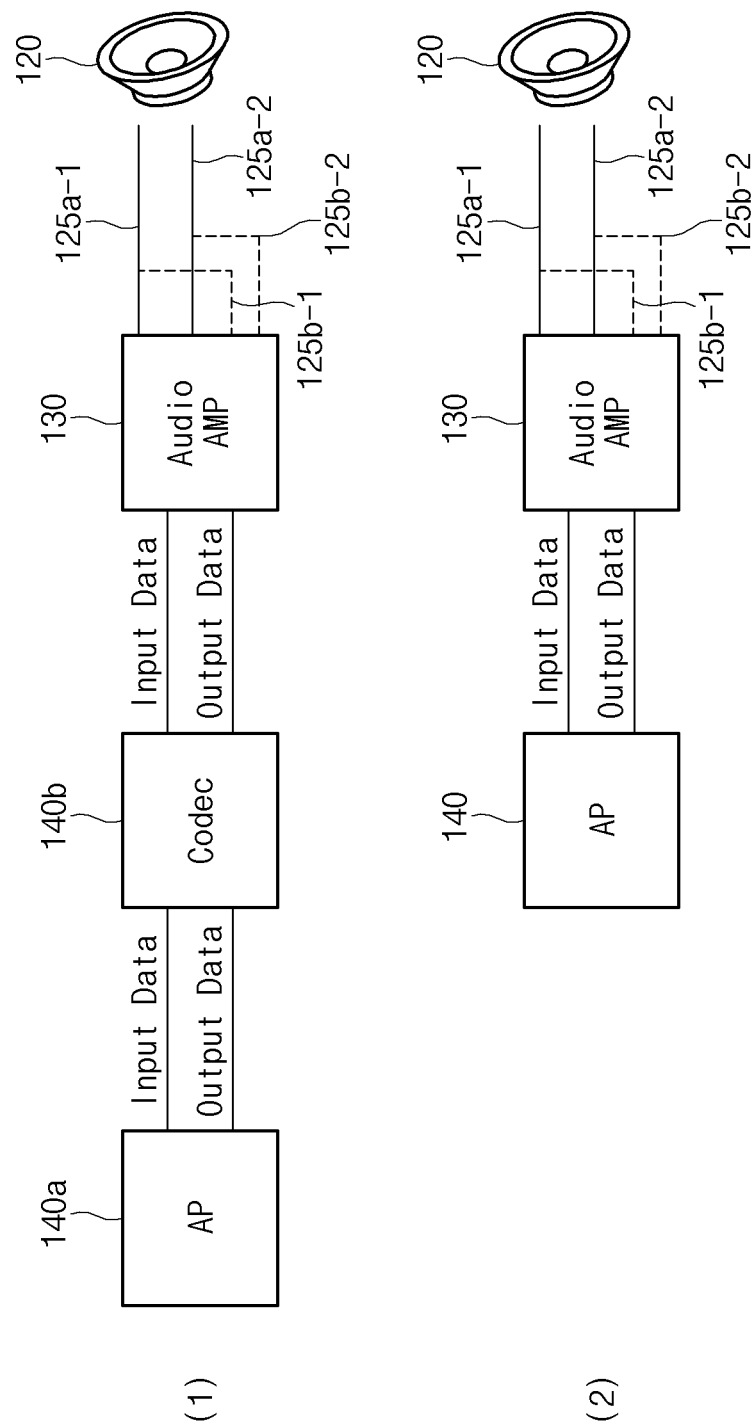
FIG. 1B illustrates a block diagram of components included in an electronic device according to various embodiments.

FIG. 1B illustrates a block diagram of components included in an electronic device according to various embodiments.

Referring to FIG. 1B, the electronic device 100 according to various embodiments may include an application processor 140*a*, a codec 140*b*, the amplifier 130, and the speaker 120.

Referring to Drawing (1) and Drawing (2), the audio signal may be output from the amplifier 130 to the speaker 120 through electrical paths 125*a*-1 and 125*a*-2. The feedback signal may be transmitted to the amplifier 130 through feedback paths 125*b*-1 and 125*b*-2 from a point adjacent to the speaker 120.

In various embodiments, the thermal protection operation may be performed by an ARM processor or a digital signal processor (DSP).

Referring to Drawing (1), the ARM processor or the DSP may be included in the codec 140*b* or the amplifier 130. The application processor 140*a* may control the codec 140*b* or the amplifier 130 to perform the thermal protection operation.

Referring to Drawing (2), the ARM processor or the DSP may be included in the application processor 140*a*. The application processor 140*a* may perform the thermal protection operation for the speaker 120.

Figure 1C:
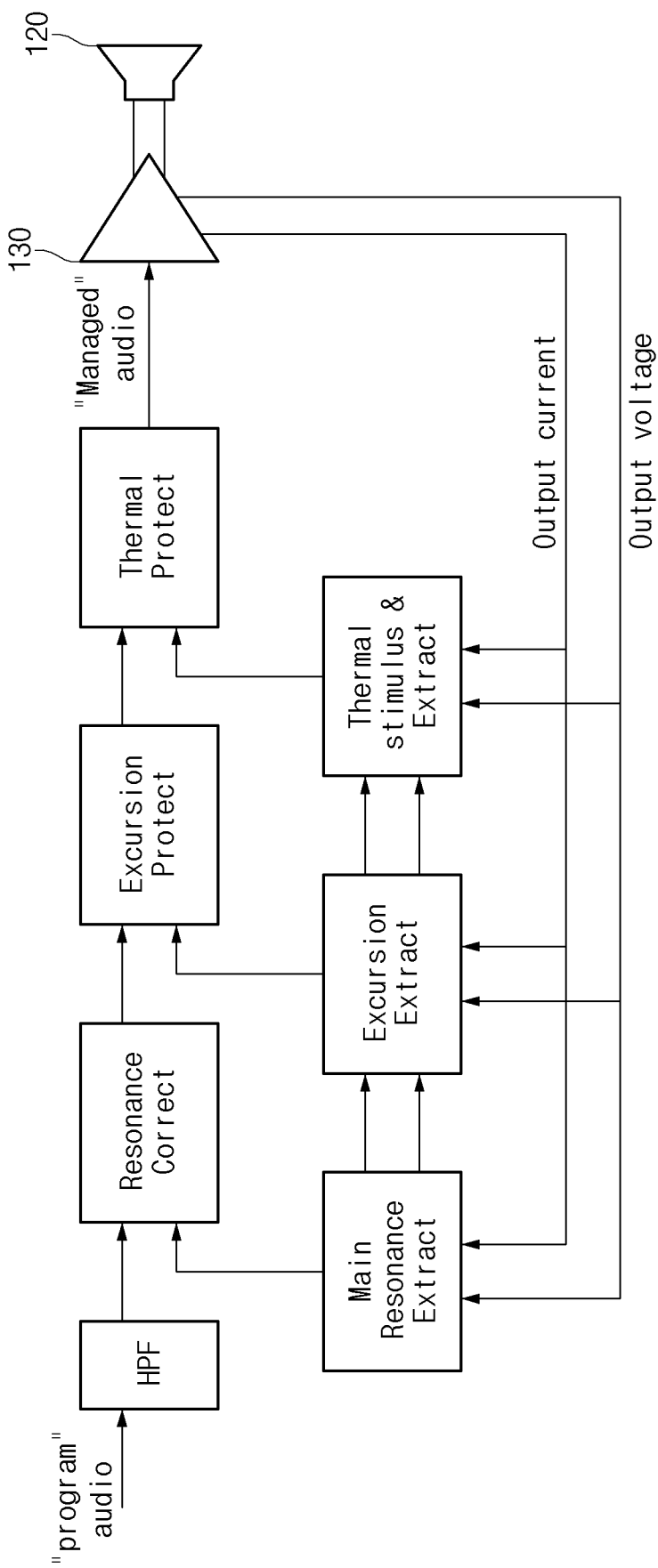
FIG. 1C is a flow diagram of an audio signal according to various embodiments.

FIG. 1C is a flow diagram of an audio signal according to various embodiments.

Referring to FIG. 1C, the electronic device 100 according to various embodiments may perform resonance correct. The electronic device 100 may measure a vibration amount of the speaker 120 and perform a vibration protection operation (excursion protect) to protect the speaker 120 from being damaged by a vibration. The electronic device 100 may perform the thermal protection operation (thermal protect).

According to various embodiments, the electronic device 100 may perform the thermal protection operation after the vibration protection operation. In this connection, the electronic device 100 may compare the volume level of the audio signal with a threshold volume value determined such that the thermal protection operation may be performed. When the volume level of the audio signal is less than the threshold volume value, the thermal protection operation may be bypassed without being performed. A malfunction of the thermal protection operation resulted from the contact resistance may be prevented.

The electronic device 100 may perform the thermal protection operation only when the volume level of the audio signal is greater than the threshold volume value. The electronic device 100 may measure a present current value (an output current) and a present current voltage value (an output voltage), and calculate the resistance. The temperature of the speaker 120 may be estimated from the resistance value. The electronic device 100 may perform the thermal protection operation using the estimated temperature value.

Figure 2:
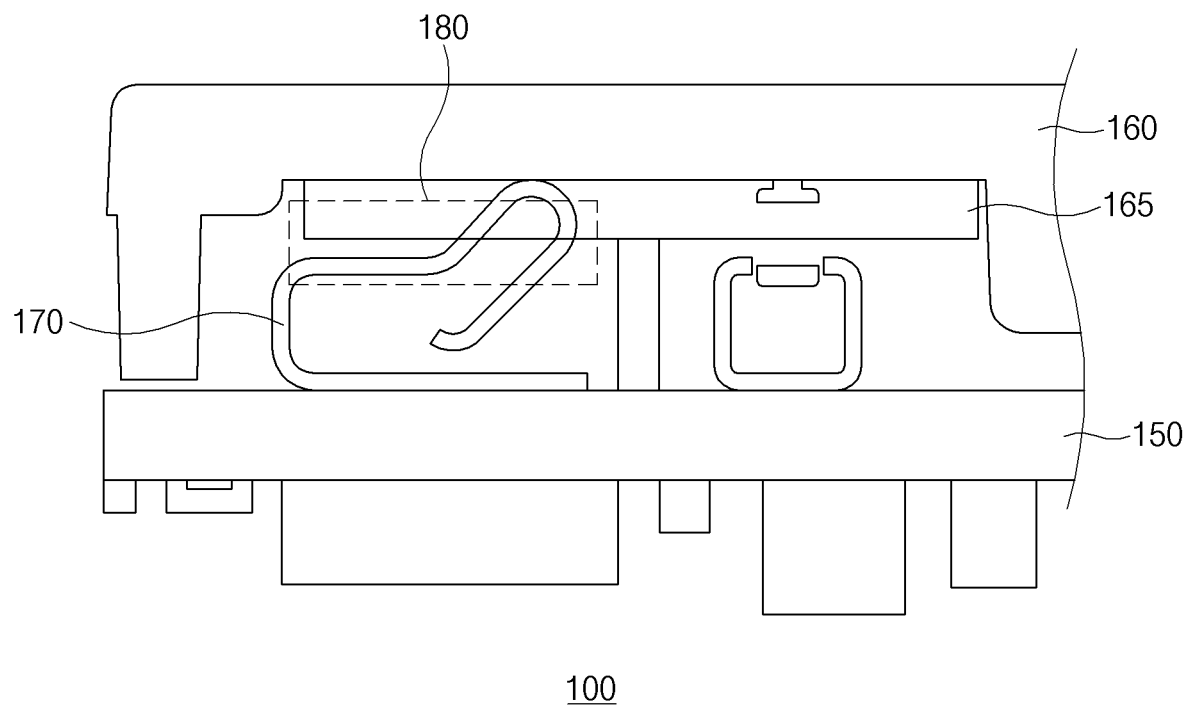
FIG. 2 is a view for describing an example of a contact resistance in an electronic device according to one embodiment of the disclosure.

FIG. 2 is a view for describing an example of a contact resistance in an electronic device according to one embodiment of the disclosure. In the disclosure, the reference numerals shown in FIG. 1A may be cited.

Referring to FIG. 2, the electronic device 100 according to an embodiment may include a printed circuit board (PCB) 150 on which the at least one processor 140 and the amplifier 130 are disposed, and a flexible printed circuit board (FPCB) 160 on which the speaker 120 is disposed. Further, the electronic device 100 may include a connecting member 180 for connecting the PCB 150 and the FPCB 160 with each other. For example, the connecting member 170 may be referred to as a c-clip.

In one embodiment, the contact resistance may be generated by a contact portion 180 of the FPCB 160 and the connecting member 170. For example, when there is a foreign material on the contact portion 180, the contact resistance may be increased. For example, the contact resistance may be increased by a crack at a metal layer of a pad 165 of the FPCB 160.

Referring to FIG. 1A again, the first audio signal may be transmitted from the first point 127 to the processor 140 through the amplifier 130. A corresponding path may be referred to as the feedback path 125*b* (indicated by the dotted line). The feedback path 125*b* may include the contact portion 180 described above. The first audio signal input to the speaker 120 through the input path 125*a* (indicated by the solid line) may branch at the first point 127 and be transmitted to the processor 140 through the feedback path 125*b*. The first audio signal is affected by the contact resistance existing on the feedback path 125*b* while being transmitted to the processor 140. In various embodiments, the first audio signal transmitted through the feedback path 125*b* may be referred to as the feedback signal.

In various embodiments, the thermal protection operation may be performed as follows. The at least one processor 140 may reduce the volume level of the first audio signal based on the temperature value of the speaker 120 estimated from the first audio signal.

For example, the speaker 120 may include a coil. The temperature value of the speaker 120 may be referred to as a temperature value of the coil included in the speaker 120.

For example, when the estimated temperature value of the speaker 120 is equal to or greater than a prespecified threshold value, the at least one processor 140 may reduce the volume level of the first audio signal. The prespecified threshold value may be referred to as a threshold temperature at which the speaker 120 starts to be damaged because of heat.

For example, the at least one processor 140 may reduce the volume level of the first audio signal by a value predetermined corresponding to the estimated temperature value of the speaker 120. As the estimated temperature of the speaker 120 becomes higher, the volume level becomes reduced more, so that the damage of the speaker 120 because of the high temperature may be prevented.

In various embodiments, the at least one processor 140 may reduce the volume level of the first audio signal by a second volume level predetermined corresponding to the first volume level of the first audio signal. A magnitude of the contact resistance, which depends on the volume level of the first audio signal, may be considered.

For example, the at least one processor 140 may divide a range of the volume level of the first audio signal into a plurality of sections, and perform different thermal protection operations respectively corresponding to the plurality of sections.

For example, as the intensity of the current becomes lower, the estimated temperature of the speaker 120 may become higher than the actual temperature of the speaker 120. Thus, when the first volume level is low, the second volume level corresponding to the first volume level may be set low. On the other hand, as the intensity of the current becomes higher, the estimated temperature of the speaker 120 may become similar to the actual temperature of the speaker 120. Thus, when the first volume level is high, the second volume level corresponding to the first volume may be set relatively high. An additional description will be described later with reference to FIG. 5.

Figure 3:
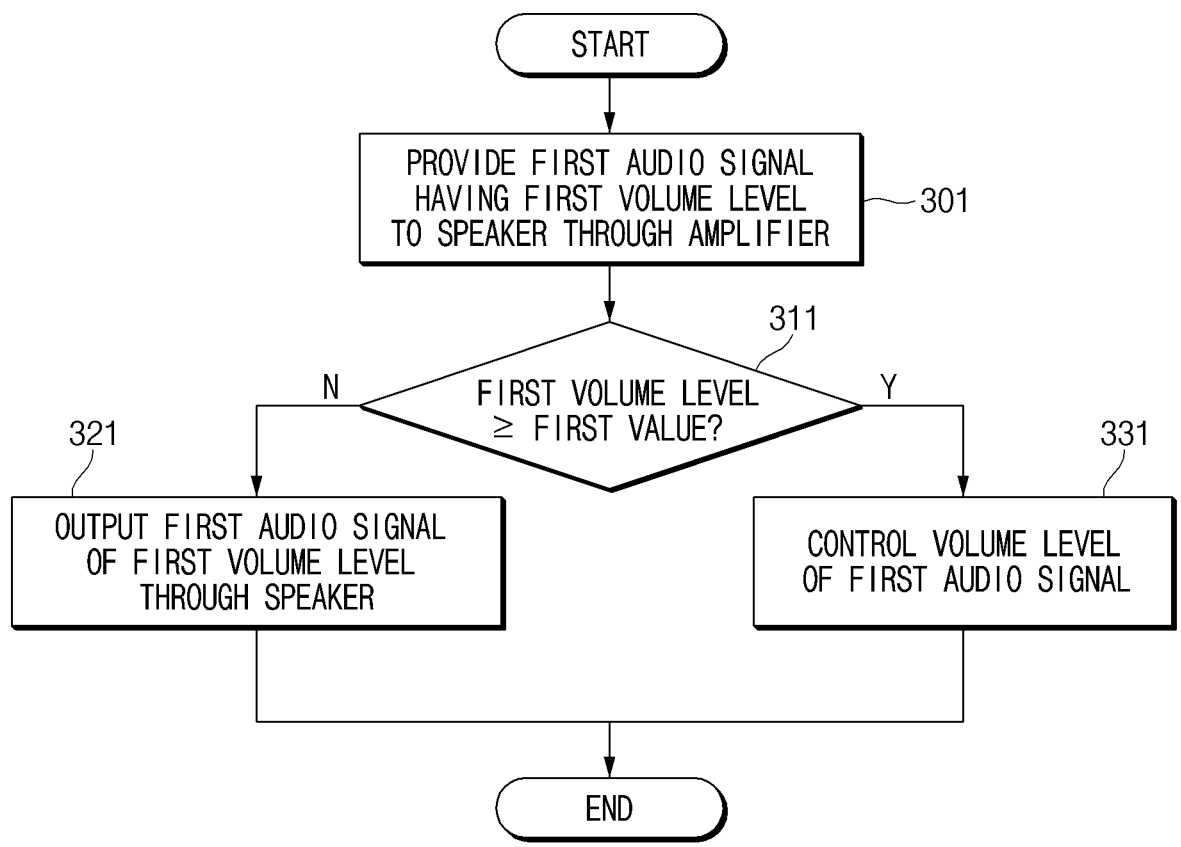
FIG. 3 illustrates a thermal protection method performed by an electronic device according to one embodiment of the disclosure.

FIG. 3 illustrates a thermal protection method performed by an electronic device according to one embodiment of the disclosure.

Referring to FIG. 3, operations 301 to 331 may be performed by at least one processor (e.g., the at least one processor 140 in FIG. 1A) of an electronic device (e.g., the electronic device 100 in FIG. 1A).

In operation 301, an electronic device (e.g., the electronic device 100 in FIG. 1A) may provide a first audio signal set to a first volume level to a speaker (e.g., the speaker 120 in FIG. 1A) through an amplifier (e.g., the amplifier 130 in FIG. 1A). For example, a volume level of the first audio signal to be provided to the speaker may be set in advance to the first volume level.

In operation 311, the electronic device may compare the first volume level with a predetermined first value. As described above, the first value may be referred to as a threshold value for performing a thermal protection operation for the speaker. For example, the electronic device may compare the volume value set for the first audio signal with the threshold value.

In operation 321, when the first volume level is less than the prespecified first value, the electronic device may output the first audio signal of the first volume level through the speaker. That is, the thermal protection operation may not be performed.

In operation 331, when the first volume level is equal to or greater than the first value, the electronic device may estimate a temperature value of the speaker based on the first audio signal. The electronic device may control the volume level of the first audio signal based on the temperature value of the speaker estimated from the first audio signal.

In operation 331 according to various embodiments, the electronic device may measure a current value and a voltage value from the first audio signal. The electronic device may calculate a resistance value from the measured current and voltage values. The electronic device may reduce the volume level of the first audio signal based on the temperature value of the speaker estimated from the resistance value.

Figure 4:
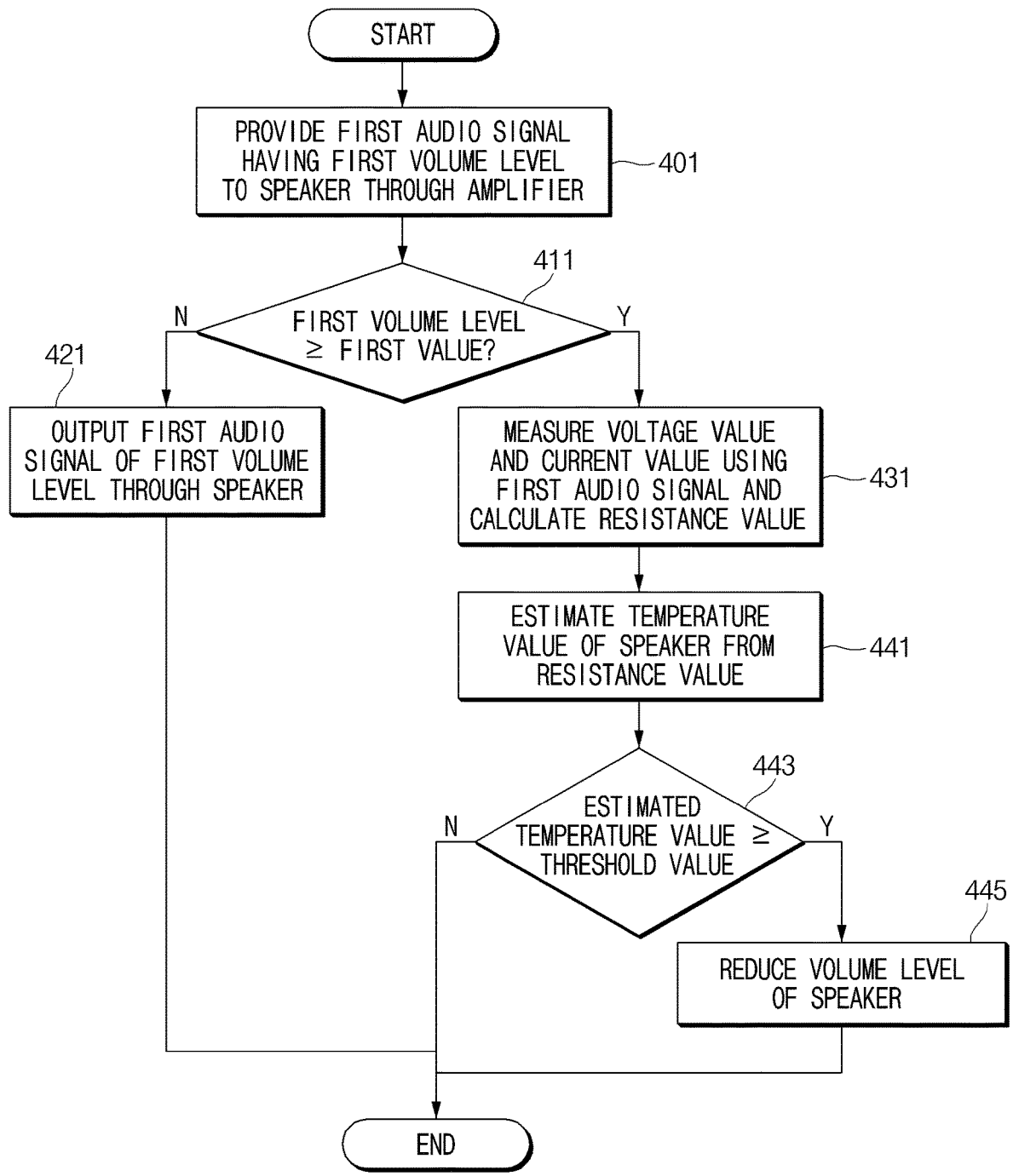
FIG. 4 illustrates a thermal protection method performed by an electronic device according to various embodiments of the disclosure.

FIG. 4 illustrates a thermal protection method performed by an electronic device according to various embodiments of the disclosure.

Referring to FIG. 4, operations 401 to 445 may be performed by at least one processor (e.g., the at least one processor 140 in FIG. 1A) of an electronic device (e.g., the electronic device 100 in FIG. 1A). Hereinafter, a description overlapping with FIG. 3 may be omitted.

In operation 401, the electronic device may provide a first audio signal having a first volume level to a speaker (e.g., the speaker 120 in FIG. 1A).

In operation 411, the electronic device may compare the first volume level with a predetermined first value. For example, the electronic device may measure a volume level of the first audio signal. The first volume level may be referred to as the volume level of the first audio signal measured by the electronic device.

In operations 431 to 445, the electronic device may perform a thermal protection operation for the speaker when the first volume level value is equal to or greater than the predetermined first value in operation 421.

In operation 431, the electronic device may measure a voltage value and a current value using the first audio signal, and calculate a resistance value.

In operation 441, the electronic device may estimate a temperature value of the speaker from the calculated resistance value. For example, the temperature value of the speaker may be referred to as a temperature value of a coil inside the speaker.

In operation 443, the electronic device may compare the estimated temperature value with a threshold value. The threshold value may be referred to, for example, as the highest temperature at which the speaker is not damaged.

In operation 445, the electronic device may reduce the volume level of the speaker when the estimated temperature value is greater than the threshold value.

In another embodiment, when the resistance value calculated in operation 441 is equal to or greater than a predetermined value, the electronic device may reduce the volume level of the speaker. The electronic device may not estimate the temperature value from the resistance value but perform a thermal protection method based on the resistance value.

The electronic device according to various embodiments may provide a third audio signal in which a second audio signal having a first frequency is mixed with the first audio signal set to the first volume level to the speaker in operation 401. For example, the second audio signal may be referred to as a pilot tone.

The electronic device according to various embodiments may obtain a feedback signal corresponding to the third audio signal from a first point (e.g., the first point 127 in FIG. 1A) adjacent to the speaker on a first electrical path (e.g., the first electrical paths 125a and 125b) between the speaker and an amplifier (e.g., the amplifier 130 in FIG. 1A) in operation 411. The electronic device according to various embodiments may filter the feedback signal corresponding to the third audio signal to extract the feedback signal having the first frequency and corresponding to the third audio signal. The feedback signal having the first frequency and corresponding to the third audio signal may be referred to as an audio signal transformed from the mixed second audio signal and having the same frequency as the second audio signal.

The electronic device according to various embodiments may perform the thermal protection operation based on the extracted feedback signal when the first volume level value is equal to or greater than the predetermined first value in operation 411.

The electronic device according to various embodiments may measure the voltage value and the current value using the extracted feedback signal and calculate the resistance value in operation 431. Subsequent thermal protection operations are the same as operations 441 to 445 described above.

Figure 5:
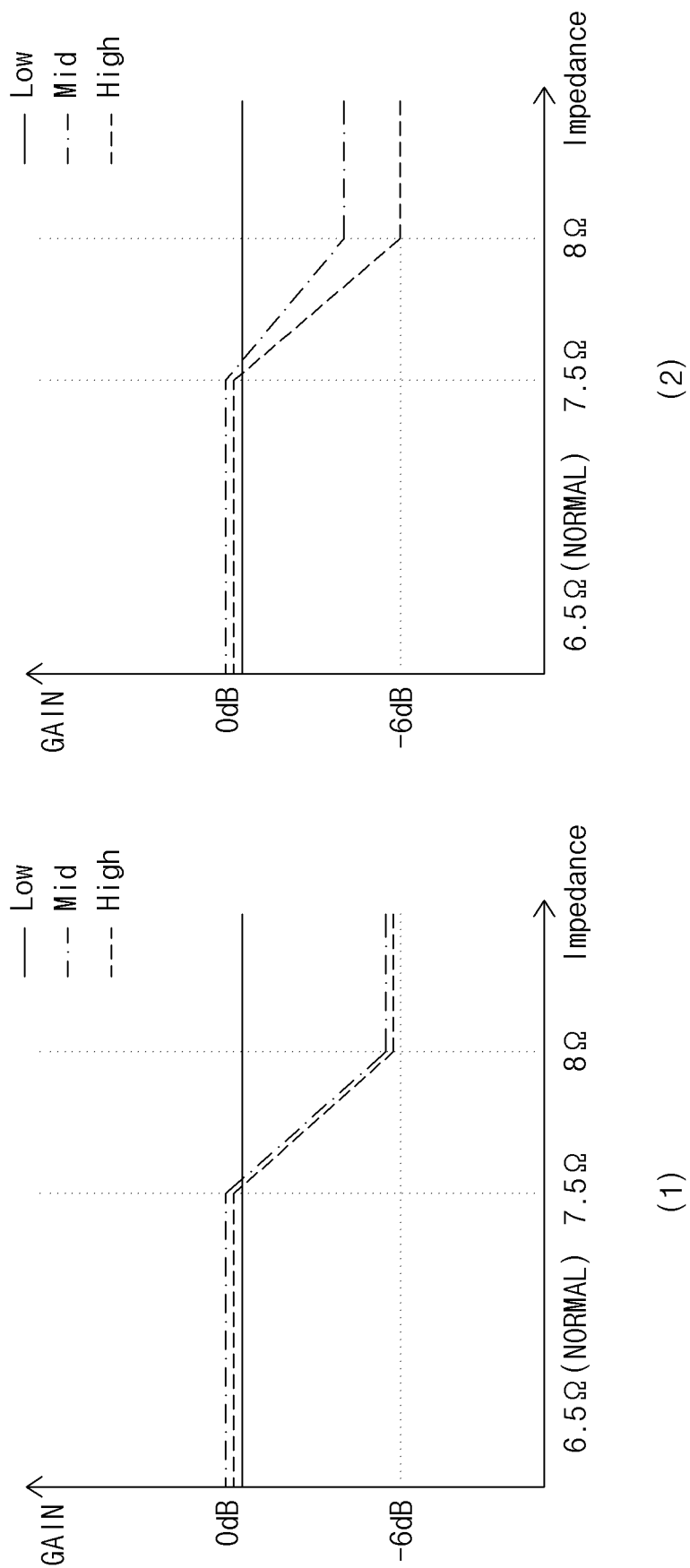
FIG. 5 is a view for describing a thermal protection method performed by an electronic device according to various embodiments of the disclosure.

FIG. 5 is a view for describing a thermal protection method performed by an electronic device according to various embodiments of the disclosure.

Referring to FIG. 5, an x-axis represents a measured resistance value, and a y-axis represents a volume level of an audio signal that is reduced based on a thermal protection operation performed by an electronic device. For example, the y-axis may be referred to as a speaker gain of an application processor. A thermal protection operation performed based on a measured resistance value is illustrated. However, the thermal protection operation may be performed based on a temperature value estimated from the measured resistance value.

For example, an application processor (e.g., the application processor 140a in FIG. 1B) or a codec (e.g., the codec 140b in FIG. 1B) of the electronic device may measure the volume level of the audio signal. The electronic device may perform the thermal protection operation based on the measured volume level.

Referring to a graph (1) of FIG. 5, the thermal protection operation performed by the electronic device according to an embodiment may be performed when a volume level of an audio signal (e.g., the first audio signal in FIG. 1A) provided to a speaker (e.g., the speaker 120 in FIG. 1A) is equal to or greater than a specific value. For example, on the basis of one first value, when a first volume level of the audio signal is less than a first value, the electronic device may not perform the thermal protection operation (low in the graph (1)).

For example, when the first volume level of the audio signal is equal to or greater than the first value, the electronic device may perform the thermal protection operation (mid and high in the graph (1)). The electronic device may reduce the volume level of the audio signal by a predetermined volume level for the first volume level and the measured resistance value.

Referring to the graph (1), the electronic device may reduce the volume level of the audio signal when the first volume is the mid value and the measured resistance value exceeds 7.5 ohms. For example, when the first volume is the mid value and the measured resistance value increases from 7.5 ohms to 8 ohms, the volume level to be reduced may gradually increase from 0 dB to 6 dB. When the first volume is the mid value and the measured resistance value is 8 ohms or higher, the volume value to be reduced may be uniformly set to 6 dB.

Referring to a graph (2), a thermal protection operation performed by the electronic device according to another embodiment may be performed when the first volume level of the audio signal provided to the speaker is equal to or greater than the specific value. In addition, the thermal protection operation may be performed differently based on the first volume level of the audio signal provided to the speaker.

For example, the electronic device may not perform the thermal protection operation when the first volume level of the audio signal is less than the first value based on the first value (the low in the graph (1)).

For example, when the first volume level of the audio signal is equal to or greater than the first value, the electronic device may dynamically perform the thermal protection operation based on the volume level. For example, the electronic device may reduce the volume level of the audio signal by a value predetermined corresponding to each volume level.

Referring to the graph (2), when the first volume level is the mid value, the electronic device may reduce the volume level of the audio signal less than when the first volume level is the high value. As the first volume level increases, the effect of the contact resistance decreases, so that the thermal protection operation may be preset to be performed dynamically in consideration of a relationship between the volume level and the contact resistance.

Referring to the graph (2), when the first volume level is greater than the low value and the measured resistance value exceeds 7.5 ohms, the electronic device may reduce the volume level of the audio signal.

For example, when the first volume level is the mid value and the measured resistance value increases from 7.5 ohms to 8 ohms, the volume value to be reduced may gradually increase from 0 dB to 4 dB. When the first volume level is the mid value and the measured resistance value is 8 ohms or higher, the volume value to be reduced may be uniformly set to 4 dB.

For example, when the first volume level is the high value and the measured resistance value increases from 7.5 ohms to 8 ohms, the volume value to be reduced may gradually increase from 0 dB to 6 dB. When the first volume is high and the measured resistance value is 8 ohms or higher, the volume value to be reduced may be uniformly set to 6 dB.

In various embodiments, the electronic device may reduce the volume level of the audio signal by the prespecified second volume level determined in correspondence with the first volume level and the estimated temperature value of the speaker.

Figure 6:
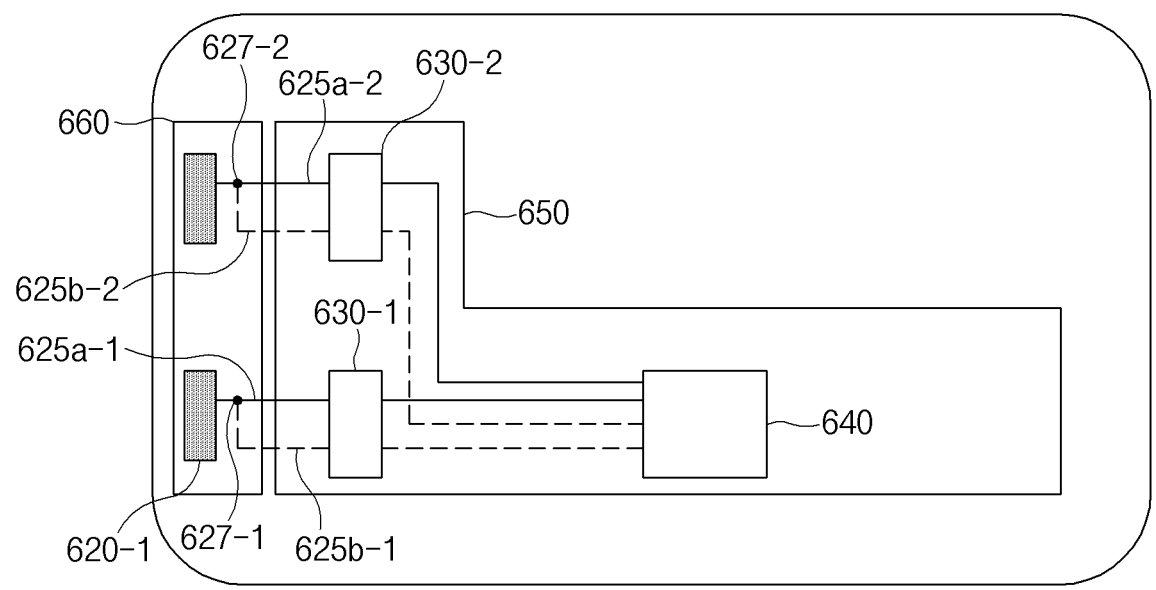
FIG. 6 illustrates an internal structural diagram of an electronic device according to various embodiments of the disclosure.

FIG. 6 illustrates an internal structural diagram of an electronic device according to various embodiments of the disclosure.

Referring to FIG. 6, an electronic device 600 (e.g., the electronic device 100 in FIG. 1A) according to an embodiment may include a plurality of speakers 630-1 and 630-2 and a plurality of amplifiers 630-1 and 630-2.

In one embodiment, the electronic device 600 may include the first amplifier 630-1 connected to the first speaker 620-1 through electrical paths 625*a*-1 and 625*b*-1, and the second amplifier 630-2 connected to the second speaker 620-2 through electrical paths 625*a*-2 and 625*b*-2. An audio signal may be transmitted and received through the electrical paths 625*a*-1, 625*b*-1, 625*a*-2, and 625*b*-2. In FIG. 6, the electronic device including two speakers is illustrated as an example. However, the disclosure may not be limited thereto, and the electronic device 600 may include at least three speakers and a plurality of amplifiers respectively connected to the three or more speakers.

In one embodiment, the electronic device 600 may include at least one processor 640 (e.g., the processor 140 in FIG. 1A) electrically connected to the first amplifier 630-1 and the second amplifier 630-2. The processor 640 may be referred to as at least one application processor and/or an ARM processor or a digital signal processor included in each of the plurality of amplifiers 630-1 and 630-1. Referring to FIG. 6, one application processor 640 is illustrated as an example.

The electronic device 600 may independently perform a thermal protection operation according to various embodiments of the disclosure for each of the plurality of speakers 605-1 and 605-2. When a first volume level of a first audio signal provided to the first speaker 605-1 is equal to or greater than a first value, the electronic device 600 may perform a thermal protection operation for the first speaker 605-1. When a second volume level of a second audio signal provided to the second speaker 106-2 is equal to or greater than the first value, the electronic device 600 may perform a thermal protection operation for the second speaker 605-2. The first value and the second value may be set differently for the plurality of speakers.

An electronic device (e.g., the electronic device 100 in FIG. 1) according to various embodiments may include a speaker (e.g., the speaker 120 in FIG. 1), an amplifier (e.g., the amplifier 130 in FIG. 1) connected to the speaker through a first electrical path (e.g., the electrical path 125*a* in FIG. 1), and at least one processor (e.g., the processor 140 in FIG. 1) electrically connected to the amplifier, wherein the at least one processor may provide a first audio signal set to a first volume level to the speaker through the amplifier, output the first audio signal at the first volume level through the speaker when the first volume level is less than a prespecified first value, and control a volume level of the first audio signal based on a temperature value of the speaker estimated from the first audio signal when the first volume level is equal to or greater than the first value.

The at least one processor according to various embodiments may obtain a feedback signal corresponding to the first audio signal from a first point (e.g., the first point 127 in FIG. 1) on the first electrical path adjacent to the speaker, ignore the obtained feedback signal when the first volume level is less than the prespecified first value, and estimate the temperature value of the speaker using the feedback signal when the first volume level is equal to or greater than the first value.

The at least one processor according to various embodiments may reduce the volume level of the first audio signal when the first volume level is equal to or greater than the first value and when the estimated temperature value of the speaker is equal to or greater than a prespecified threshold value.

The at least one processor according to various embodiments may reduce the volume level of the first audio signal by a second volume level prespecified corresponding to the estimated temperature value of the speaker.

The at least one processor according to various embodiments may reduce the volume level of the first audio signal by a second volume level prespecified corresponding to the first volume level.

The at least one processor according to various embodiments may reduce the volume level of the first audio signal by a second volume level prespecified corresponding to the first volume level and the estimated temperature value of the speaker.

The at least one processor according to various embodiments may measure a current value and a voltage value from the obtained feedback signal, and estimate the temperature value of the speaker based on a resistance value calculated from the current value and the voltage value.

The at least one processor according to various embodiments may reduce the volume level of the first audio signal by a second volume level prespecified corresponding to the first volume level and the calculated resistance value.

The electronic device according to various embodiments may further include a coil included in the speaker, wherein the at least one processor may control the volume level of the first audio signal based on a temperature value of the coil estimated from the first audio signal when the first volume level is equal to or greater than the first value.

The at least one processor according to various embodiments may control the volume level of the first audio signal based on a resistance value calculated from the first audio signal when the first volume level is equal to or greater than the first value.

The at least one processor according to various embodiments may reduce the volume level of the first audio signal when the calculated resistance value is equal to or greater than a prespecified value.

The at least one processor according to various embodiments may reduce the volume level of the first audio signal by a second volume level predetermined corresponding to the first volume level and the calculated resistance value.

The electronic device according to various embodiments may further include a PCB (e.g., the PCB 150 in FIG. 2) having the at least one processor and the amplifier disposed on the PCB, a FPCB (e.g., the FPCB 160 in FIG. 2) having the speaker disposed on the FPCB, and a connecting member (e.g., the connecting member 170 in FIG. 2) for connecting the PCB and the FPCB with each other.

The at least one processor according to various embodiments may obtain the feedback signal through an electrical path connected from the first point on the FPCB to the processor on the PCB.

An electronic device (e.g., the electronic device 100 in FIG. 1) according to various embodiments may include a speaker (e.g., the speaker 120 in FIG. 1) and at least one processor (e.g., the processor 140 in FIG. 1) electrically connected to the speaker, wherein the at least one processor may identify a volume level of an audio signal input to the speaker, output the audio signal at the volume level through the speaker when the volume level falls within a prespecified first range, estimate a temperature of the speaker using a voltage value or a current value of the audio signal input to the speaker when the volume level falls within a second range greater than the first range, and adjust the volume level of the audio signal to a volume level lower than the identified volume level based on the temperature of the speaker and output the adjusted audio signal.

The electronic device according to various embodiments may further include a connecting member (e.g., the connecting member 170 in FIG. 2) positioned on an electrical path (e.g., the electrical path 125*b* in FIG. 1) for connecting the speaker with the at least one processor.

The at least one processor according to various embodiments may be refrained from adjusting the volume level of the audio signal to the volume level lower than the measured volume level when the volume level falls within the prespecified first range.

The at least one processor according to various embodiments may adjust the volume level of the audio signal to the volume level lower than the identified volume level when the temperature of the speaker is greater than a threshold temperature and output the adjusted audio signal.

The connecting member according to various embodiments may include a c-clip.

An electronic device according to various embodiments may further include a codec (e.g., the codec 140*b* in FIG. 1B), and an amplifier (e.g., the amplifier 130 in FIG. 1B), wherein at least one processor (e.g., the processor 140 in FIG. 1) may be an application processor (e.g., the application processor 140*a* in FIG. 1B), or an ARM processor or a digital signal processor included in the codec or the amplifier.

Figure 7:
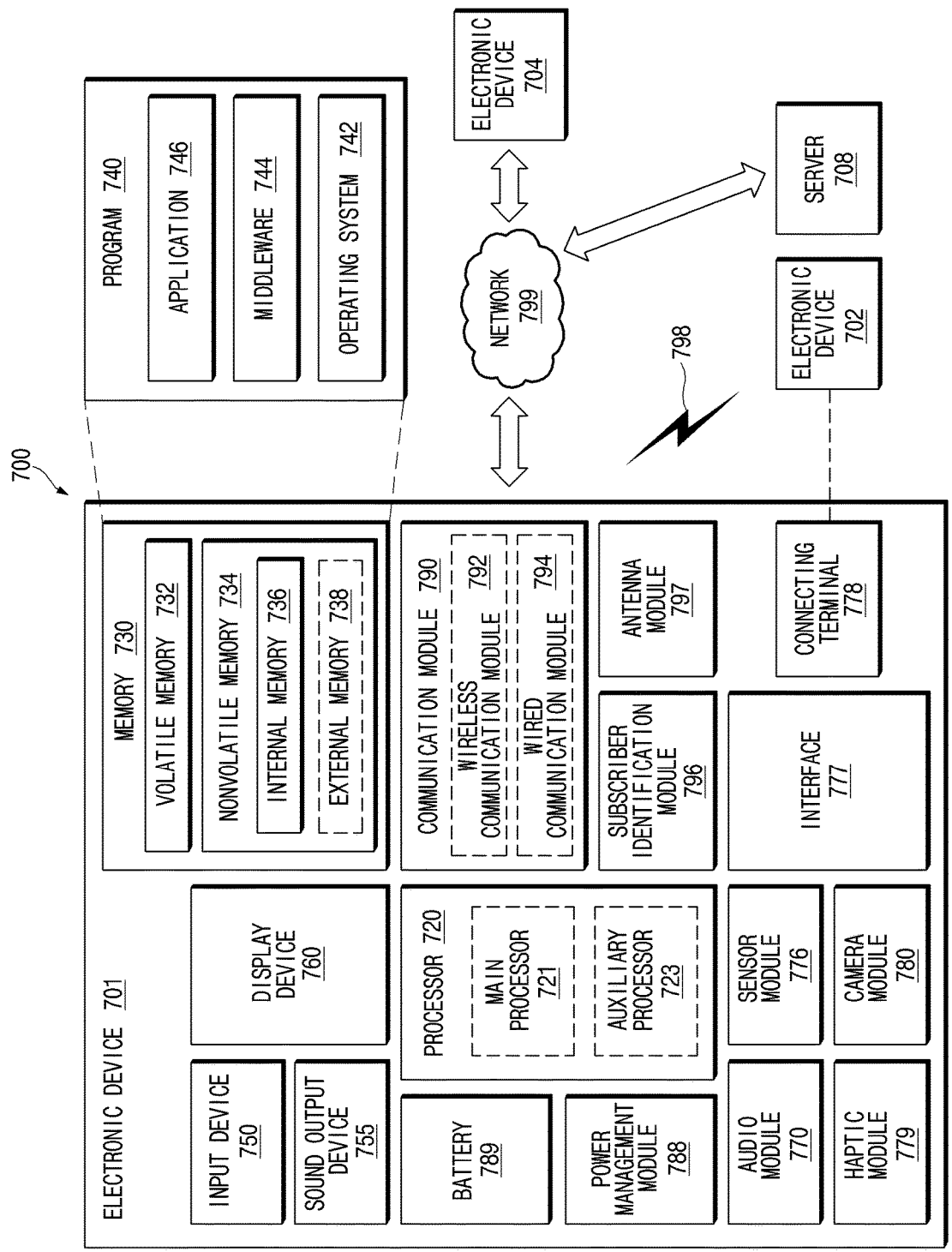
FIG. 7 is a block diagram of an electronic device in a network environment according to various embodiments.

FIG. 7 is a block diagram of an electronic device in a network environment according to various embodiments. Referring to FIG. 7, an electronic device 701 may communicate with an electronic device 702 through a first network 798 (e.g., a short-range wireless communication) or may communicate with an electronic device 704 or a server 708 through a second network 799 (e.g., a long-distance wireless communication) in a network environment 700. According to an embodiment, the electronic device 701 may communicate with the electronic device 704 through the server 708.

According to an embodiment, the electronic device 701 may include a processor 720, a memory 730, an input device 750, a sound output device 755, a display device 760, an audio module 770, a sensor module 776, an interface 777, a haptic module 779, a camera module 780, a power management module 788, a battery 789, a communication module 790, a subscriber identification module 796, and an antenna module 797. According to some embodiments, at least one (e.g., the display device 760 or the camera module 780) among components of the electronic device 701 may be omitted or other components may be added to the electronic device 701. According to some embodiments, some components may be integrated and implemented as in the case of the sensor module 776 (e.g., a fingerprint sensor, an iris sensor, or an illuminance sensor) embedded in the display device 760 (e.g., a display).

The processor 720 may operate, for example, software (e.g., a program 740) to control at least one of other components (e.g., a hardware or software component) of the electronic device 701 connected to the processor 720 and may process and compute a variety of data. The processor 720 may load a command set or data, which is received from other components (e.g., the sensor module 776 or the communication module 790), into a volatile memory 732, may process the loaded command or data, and may store result data into a nonvolatile memory 734. According to an embodiment, the processor 720 may include a main processor 721 (e.g., a central processing unit or an application processor) and an auxiliary processor 723 (e.g., a graphic processing device, an image signal processor, a sensor hub processor, or a communication processor), which operates independently from the main processor 721, additionally or alternatively uses less power than the main processor 721, or is specified to a designated function. In this case, the auxiliary processor 723 may operate separately from the main processor 721 or embedded.

In this case, the auxiliary processor 723 may control, for example, at least some of functions or states associated with at least one component (e.g., the display device 760, the sensor module 776, or the communication module 790) among the components of the electronic device 701 instead of the main processor 721 while the main processor 721 is in an inactive (e.g., sleep) state or together with the main processor 721 while the main processor 721 is in an active (e.g., an application execution) state. According to an embodiment, the auxiliary processor 723 (e.g., the image signal processor or the communication processor) may be implemented as a part of another component (e.g., the camera module 780 or the communication module 790) that is functionally related to the auxiliary processor 723. The memory 730 may store a variety of data used by at least one component (e.g., the processor 720 or the sensor module 776) of the electronic device 701, for example, software (e.g., the program 740) and input data or output data with respect to commands associated with the software. The memory 730 may include the volatile memory 732 or the nonvolatile memory 734.

The program 740 may be stored in the memory 730 as software and may include, for example, an operating system 742, a middleware 744, or an application 746.

The input device 750 may be a device for receiving a command or data, which is used for a component (e.g., the processor 720) of the electronic device 701, from an outside (e.g., a user) of the electronic device 701 and may include, for example, a microphone, a mouse, or a keyboard.

The sound output device 755 may be a device for outputting a sound signal to the outside of the electronic device 701 and may include, for example, a speaker used for general purposes, such as multimedia play or recordings play, and a receiver used only for receiving calls. According to an embodiment, the receiver and the speaker may be either integrally or separately implemented.

The display device 760 may be a device for visually presenting information to the user of the electronic device 701 and may include, for example, a display, a hologram device, or a projector and a control circuit for controlling a corresponding device. According to an embodiment, the display device 760 may include a touch circuitry or a pressure sensor for measuring an intensity of pressure on the touch.

The audio module 770 may convert a sound and an electrical signal in dual directions. According to an embodiment, the audio module 770 may obtain the sound through the input device 750 or may output the sound through an external electronic device (e.g., the electronic device 702 (e.g., a speaker or a headphone)) wired or wirelessly connected to the sound output device 755 or the electronic device 701.

The sensor module 776 may generate an electrical signal or a data value corresponding to an operating state (e.g., power or temperature) inside or an environmental state outside the electronic device 701. The sensor module 776 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 777 may support a designated protocol wired or wirelessly connected to the external electronic device (e.g., the electronic device 702). According to an embodiment, the interface 777 may include, for example, an HDMI (high-definition multimedia interface), a USB (universal serial bus) interface, an SD card interface, or an audio interface.

A connecting terminal 778 may include a connector that physically connects the electronic device 701 to the external electronic device (e.g., the electronic device 702), for example, an HDMI connector, a USB connector, an SD card connector, or an audio connector (e.g., a headphone connector).

The haptic module 779 may convert an electrical signal to a mechanical stimulation (e.g., vibration or movement) or an electrical stimulation perceived by the user through tactile or kinesthetic sensations. The haptic module 779 may include, for example, a motor, a piezoelectric element, or an electric stimulator.

The camera module 780 may shoot a still image or a video image. According to an embodiment, the camera module 780 may include, for example, at least one lens, an image sensor, an image signal processor, or a flash.

The power management module 788 may be a module for managing power supplied to the electronic device 701 and may serve as at least a part of a power management integrated circuit (PMIC).

The battery 789 may be a device for supplying power to at least one component of the electronic device 701 and may include, for example, a non-rechargeable (primary) battery, a rechargeable (secondary) battery, or a fuel cell.

The communication module 790 may establish a wired or wireless communication channel between the electronic device 701 and the external electronic device (e.g., the electronic device 702, the electronic device 704, or the server 708) and support communication execution through the established communication channel. The communication module 790 may include at least one communication processor operating independently from the processor 720 (e.g., the application processor) and supporting the wired communication or the wireless communication. According to an embodiment, the communication module 790 may include a wireless communication module 792 (e.g., a cellular communication module, a short-range wireless communication module, or a GNSS (global navigation satellite system) communication module) or a wired communication module 794 (e.g., an LAN (local area network) communication module or a power line communication module) and may communicate with the external electronic device using a corresponding communication module among them through the first network 798 (e.g., the short-range communication network such as a Bluetooth, a WiFi direct, or an IrDA (infrared data association)) or the second network 799 (e.g., the long-distance wireless communication network such as a cellular network, an internet, or a computer network (e.g., LAN or WAN)). The above-mentioned various communication modules 790 may be implemented into one chip or into separate chips, respectively.

According to an embodiment, the wireless communication module 792 may identify and authenticate the electronic device 701 using user information stored in the subscriber identification module 796 in the communication network.

The antenna module 797 may include one or more antennas to transmit or receive the signal or power to or from an external source. According to an embodiment, the communication module 790 (e.g., the wireless communication module 792) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 701 and the external electronic device 704 through the server 708 connected to the second network 799. Each of the electronic devices 702 and 704 may be the same or different types as or from the electronic device 701. According to an embodiment, all or some of the operations performed by the electronic device 701 may be performed by another electronic device or a plurality of external electronic devices. When the electronic device 701 performs some functions or services automatically or by request, the electronic device 701 may request the external electronic device to perform at least some of the functions related to the functions or services, in addition to or instead of performing the functions or services by itself. The external electronic device receiving the request may carry out the requested function or the additional function and transmit the result to the electronic device 701. The electronic device 701 may provide the requested functions or services based on the received result as is or after additionally processing the received result. To this end, for example, a cloud computing, distributed computing, or client-server computing technology may be used.

Figure 8:
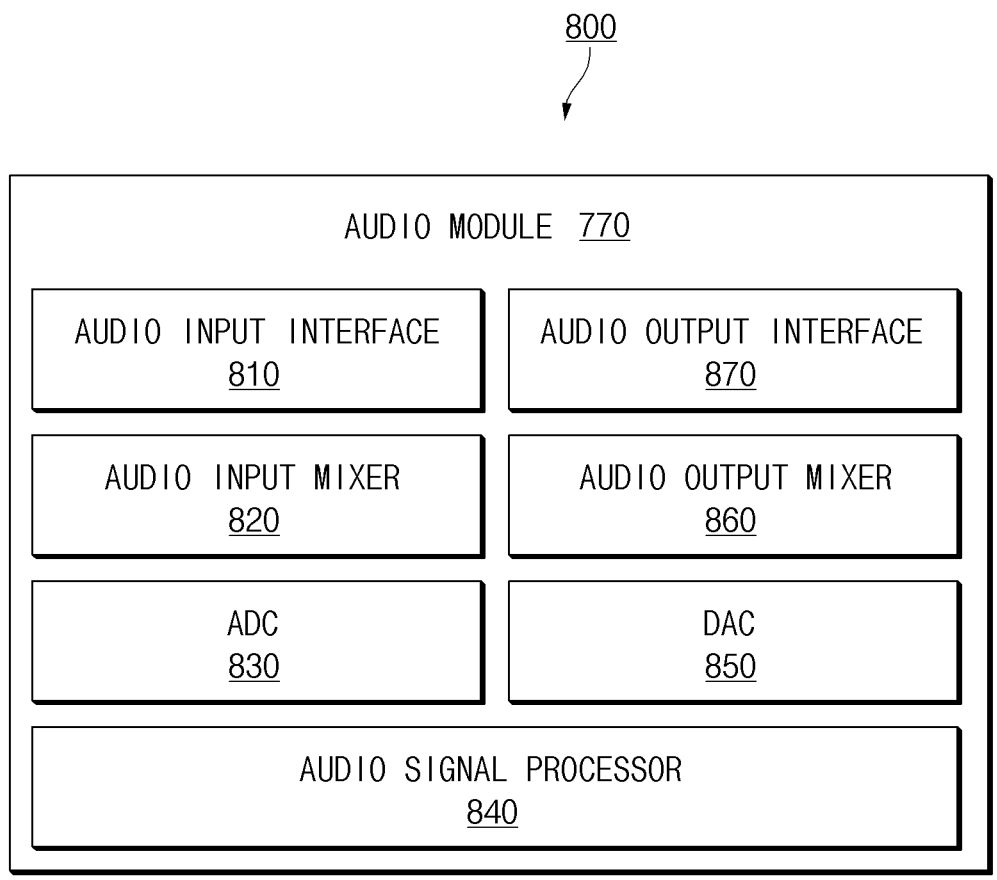
FIG. 8 is a block diagram of an audio module according to various embodiments.

FIG. 8 is a block diagram 800 of the audio module 770 according to various implementations. Referring to FIG. 8, the audio module 770 may include, for example, an audio input interface 810, an audio input mixer 820, an analog to digital converter (ADC) 830, an audio signal processor 840, a digital to analog converter (DAC) 850, an audio output mixer 860, or an audio output interface 870.

The audio input interface 810 may receive an audio signal corresponding to sound acquired from outside of the electronic device 701 through a microphone (e.g., a dynamic microphone, a condenser microphone, or a piezo microphone) configured as a portion of the input device 750 or separately from the electronic device 701. For example, when an audio signal is acquired from the external electronic device 702 (e.g., a headset or a microphone), the audio input interface 810 may be connected to the external electronic device 702 wiredly through the connecting terminal 778 or wirelessly (e.g., a Bluetooth communication) through the wireless communication module 792 to receive the audio signal. According to an embodiment, the audio input interface 810 may receive a control signal (e.g., a volume adjustment signal using an input button) associated with the audio signal acquired from the external electronic device 702. The audio input interface 810 may include a plurality of audio input channels, and may receive different audio signals for the plurality of audio input channels. According to an embodiment, additionally or alternatively, the audio input interface 810 may receive the audio signal from another component (e.g., the processor 720 or the memory 730) of the electronic device 701.

The audio input mixer 820 may synthesize the plurality of input audio signals into at least one audio signal. According to an embodiment, the audio input mixer 820 may synthesize a plurality of analog audio signals input through the audio input interface 810 into at least one analog audio signal.

The ADC 830 may convert the analog audio signal to a digital audio signal. According to an embodiment, the ADC 830 may convert the analog audio signal received through the audio input interface 810 or the analog audio signal additionally or alternatively synthesized through the audio input mixer 820 into the digital audio signal.

The audio signal processor 840 may perform various processes on the digital audio signal input through the ADC 830 or a digital audio signal received from another component of the electronic device 701. For example, the audio signal processor 840 may perform change in a sampling rate, applying of at least one filter, interpolation processing, amplification or attenuation (e.g., amplification or attenuation of some or all frequency bands), noise processing (e.g., noise or echo attenuation), change in a channel (e.g., switching between mono and stereo), mixing, or extraction of a specified signal on at least one digital audio signal. According to an embodiment, at least some functions of the audio signal processor 840 may be implemented in a form of an equalizer.

The DAC 850 may convert the digital audio signal to the analog audio signal. According to an embodiment, the DAC 850 may convert the digital audio signal processed by the audio signal processor 840 or the digital audio signal obtained from another component of the electronic device 701 into the analog audio signal.

The audio output mixer 860 may synthesize a plurality of audio signals to be output into at least one audio signal. According to an embodiment, the audio output mixer 860 may synthesize the audio signal converted into the analog signal through the DAC 850 and another analog audio signal (e.g., the analog audio signal received through the audio input interface 810) into at least one analog audio signal.

The audio output interface 870 may output the analog audio signal converted through the DAC 850, or the analog audio signal additionally or alternatively synthesized by the audio output mixer 860 to the outside of the electronic device 701 through the sound output device 755 (e.g., a speaker (e.g., a dynamic driver or a balanced armature driver), or a receiver). According to an embodiment, the sound output device 755 may include a plurality of speakers, and the audio output interface 870 may output audio signals having a plurality of different channels (e.g., a stereo or 5.1 channel) through at least some of the plurality of speakers. According to an embodiment, the audio output interface 870 may be connected to the external electronic device 702 (e.g., an external speaker or a headset) wiredly through the connecting terminal 778 or wirelessly through the wireless communication module 792 to output the audio signal.

According to an embodiment, the audio module 770 may synthesize a plurality of digital audio signals using at least some functions of the audio signal processor 840 to generate one digital audio signal without having the audio input mixer 820 or the audio output mixer 860 separately.

According to an embodiment, the audio module 770 may include an audio amplifier (not shown) (e.g., a speaker amplification circuit) capable of amplifying the analog audio signal input through the audio input interface 810 or the audio signal to be output through the audio output interface 870. According to an embodiment, the audio amplifier may be composed of a module separate from the audio module 770.

The electronic device according to various embodiments disclosed in the present disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the present disclosure should not be limited to the above-mentioned devices.

It should be understood that various embodiments of the present disclosure and terms used in the embodiments do not intend to limit technologies disclosed in the present disclosure to the particular forms disclosed herein; rather, the present disclosure should be construed to cover various modifications, equivalents, and/or alternatives of embodiments of the present disclosure. With regard to description of drawings, similar components may be assigned with similar reference numerals. As used herein, singular forms may include plural forms as well unless the context clearly indicates otherwise. In the present disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the present disclosure may be implemented by software (e.g., the program 740) including an instruction stored in a machine-readable storage media (e.g., an internal memory 736 or an external memory 738) readable by a machine (e.g., a computer). The machine may be a device that calls the instruction from the machine-readable storage media and operates depending on the called instruction and may include the electronic device (e.g., the electronic device 701). When the instruction is executed by the processor (e.g., the processor 720), the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the present disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the present disclosure may be executed sequentially, in parallel, repeatedly, or in a heuristic method. Also, at least some operations may be executed in different sequences, omitted, or other operations may be added.

The invention claimed is:

1. An electronic device comprising:
a speaker;
an amplifier connected to the speaker through a first electrical path; and
at least one processor electrically connected to the amplifier,
wherein the at least one processor is configured to:
provide a first audio signal set to a first volume level to the speaker through the amplifier;
output the first audio signal at the first volume level through the speaker when the first volume level is less than a prespecified first value; and
control a volume level of the first audio signal based on a temperature value of the speaker estimated from the first audio signal when the first volume level is equal to or greater than the first value.

2. The electronic device of claim 1, wherein the at least one processor is configured to:
obtain a feedback signal corresponding to the first audio signal from a first point on the first electrical path adjacent to the speaker;
ignore the obtained feedback signal when the first volume level is less than the prespecified first value; and
estimate the temperature value of the speaker using the feedback signal when the first volume level is equal to or greater than the first value.

3. The electronic device of claim 2, wherein the at least one processor is configured to reduce the volume level of the first audio signal when the first volume level is equal to or greater than the first value and when the estimated temperature value of the speaker is equal to or greater than a prespecified threshold value.

4. The electronic device of claim 2, wherein the at least one processor is configured to reduce the volume level of the first audio signal by a second volume level prespecified corresponding to the estimated temperature value of the speaker.

5. The electronic device of claim 2, wherein the at least one processor is configured to reduce the volume level of the first audio signal by a second volume level prespecified corresponding to the first volume level.

6. The electronic device of claim 2, wherein the at least one processor is configured to reduce the volume level of the first audio signal by a second volume level prespecified corresponding to the first volume level and the estimated temperature value of the speaker.

7. The electronic device of claim 2, wherein the at least one processor is configured to:
    measure a current value and a voltage value from the obtained feedback signal; and
    estimate the temperature value of the speaker based on a resistance value calculated from the current value and the voltage value.

8. The electronic device of claim 7, wherein the at least one processor is configured to reduce the volume level of the first audio signal by a second volume level prespecified corresponding to the first volume level and the calculated resistance value.

9. The electronic device of claim 1, further comprising:
    a coil included in the speaker,
    wherein the at least one processor is configured to control the volume level of the first audio signal based on a temperature value of the coil estimated from the first audio signal when the first volume level is equal to or greater than the first value.

10. The electronic device of claim 1, wherein the at least one processor is configured to control the volume level of the first audio signal based on a resistance value calculated from the first audio signal when the first volume level is equal to or greater than the first value.

11. The electronic device of claim 10, wherein the at least one processor is configured to reduce the volume level of the first audio signal when the calculated resistance value is equal to or greater than a prespecified value.

12. The electronic device of claim 10, wherein the at least one processor is configured to reduce the volume level of the first audio signal by a second volume level predetermined corresponding to the first volume level and the calculated resistance value.

13. The electronic device of claim 2, further comprising:
    a PCB having the at least one processor and the amplifier disposed on the PCB;
    a FPCB having the speaker disposed on the FPCB; and
    a connecting member for connecting the PCB and the FPCB with each other,
    wherein the at least one processor is configured to:
        obtain the feedback signal through an electrical path connected from the first point on the FPCB to the processor on the PCB.

14. An electronic device comprising:
    a speaker; and
    at least one processor electrically connected to the speaker,
    wherein the at least one processor is configured to:
        identify a volume level of an audio signal input to the speaker;
        output the audio signal at the volume level through the speaker when the volume level falls within a prespecified first range;
        estimate a temperature of the speaker using a voltage value or a current value of the audio signal input to the speaker when the volume level falls within a second range greater than the first range; and
        adjust the volume level of the audio signal to a volume level less than the identified volume level based on the temperature of the speaker, and output the adjusted audio signal.

15. The electronic device of claim 14, wherein the at least one processor is configured to adjust the volume level of the audio signal to the volume level lower than the identified volume level when the temperature of the speaker is greater than a threshold temperature, and output the adjusted audio signal.

* * * * *